US005699307A

United States Patent [19]
Greason et al.

[11] Patent Number: 5,699,307
[45] Date of Patent: Dec. 16, 1997

[54] METHOD AND APPARATUS FOR PROVIDING REDUNDANT MEMORY IN AN INTEGRATED CIRCUIT UTILIZING A SUBARRAY SHUFFLE REPLACEMENT SCHEME

[75] Inventors: Jeffrey K. Greason; Paul Shay, both of Portland, Oreg.

[73] Assignee: Intel Corporation, Santa Clara, Calif.

[21] Appl. No.: 672,923

[22] Filed: Jun. 28, 1996

[51] Int. Cl.$^6$ ............................................. G11C 7/00
[52] U.S. Cl. .................. 365/200; 365/201; 365/230.03
[58] Field of Search ............................ 365/200, 230.03, 365/189.02, 201; 371/2.2, 40.1

[56] References Cited

U.S. PATENT DOCUMENTS

| | | | |
|---|---|---|---|
| 5,297,085 | 3/1994 | Choi et al. | 365/230.03 |
| 5,307,316 | 4/1994 | Takemae | 365/230.03 |
| 5,386,387 | 1/1995 | Tanizaki | 365/230.03 |
| 5,404,331 | 4/1995 | McClure | 365/201 |
| 5,416,740 | 5/1995 | Fujita et al. | 365/230.03 |
| 5,426,607 | 6/1995 | Ishibashi | 365/230.03 |
| 5,459,690 | 10/1995 | Rieger et al. | 365/200 |
| 5,469,388 | 11/1995 | Park | 365/200 |
| 5,469,389 | 11/1995 | Olivo et al. | 365/200 |
| 5,469,391 | 11/1995 | Haraguchi | 365/200 |
| 5,475,648 | 12/1995 | Fujiwara | 365/230 |
| 5,576,999 | 11/1996 | Kim et al. | 365/201 |
| 5,612,964 | 3/1997 | Haraszti | 365/75 |

*Primary Examiner*—Tan T. Nguyen
*Attorney, Agent, or Firm*—Blakely, Sokoloff, Taylor & Zafman

[57] ABSTRACT

A method and an apparatus for providing an integrated circuit memory with redundancy. In one embodiment, an integrated circuit memory is organized into subarrays of rows and columns of memory cells. Each of the subarrays are sequentially grouped such that each subarray is adjacent to at least one other subarray. Included in the sequentially organized subarrays is a redundant subarray. Each subarray, including the redundant subarray, is configured to store data designated to be stored in a neighboring adjacent subarray. Therefore, if a defective memory cell is detected in any of the subarrays, the adjacent neighboring subarrays are configured to store the data designated for a neighboring subarray. As a result, the storage of data in the memory is shuffled towards the redundant subarray to implement redundancy. With the subarray organization of memory in the present invention as well as the shuffling of data into the redundant subarray, fewer non-volatile storage elements are required by the present invention which saves valuable chip area. Furthermore, with the shuffling described herein, long additional wires are not required to incorporate redundancy which increases the overall memory performance of the present invention.

28 Claims, 11 Drawing Sheets

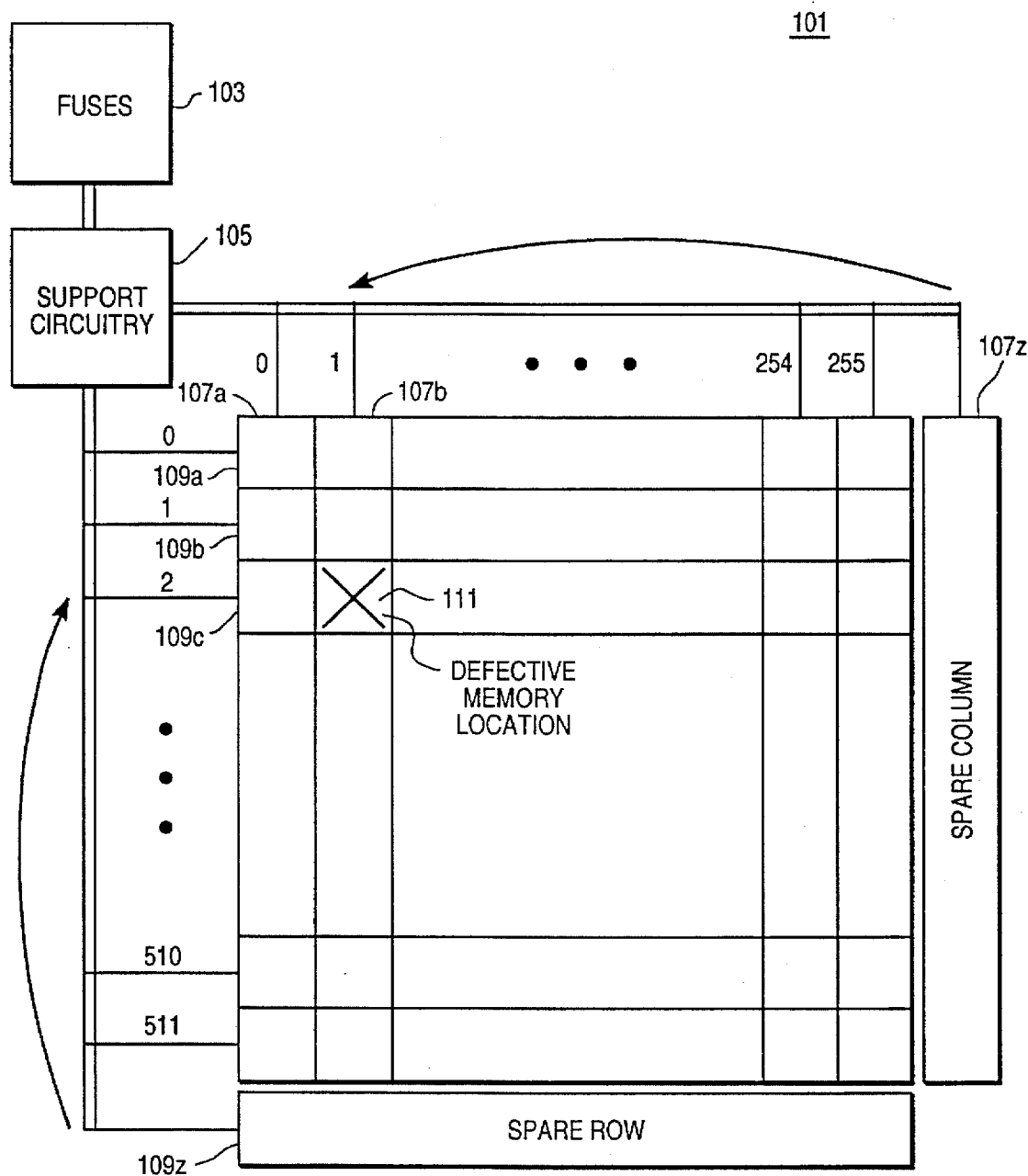
FIG_1
(PRIOR ART)

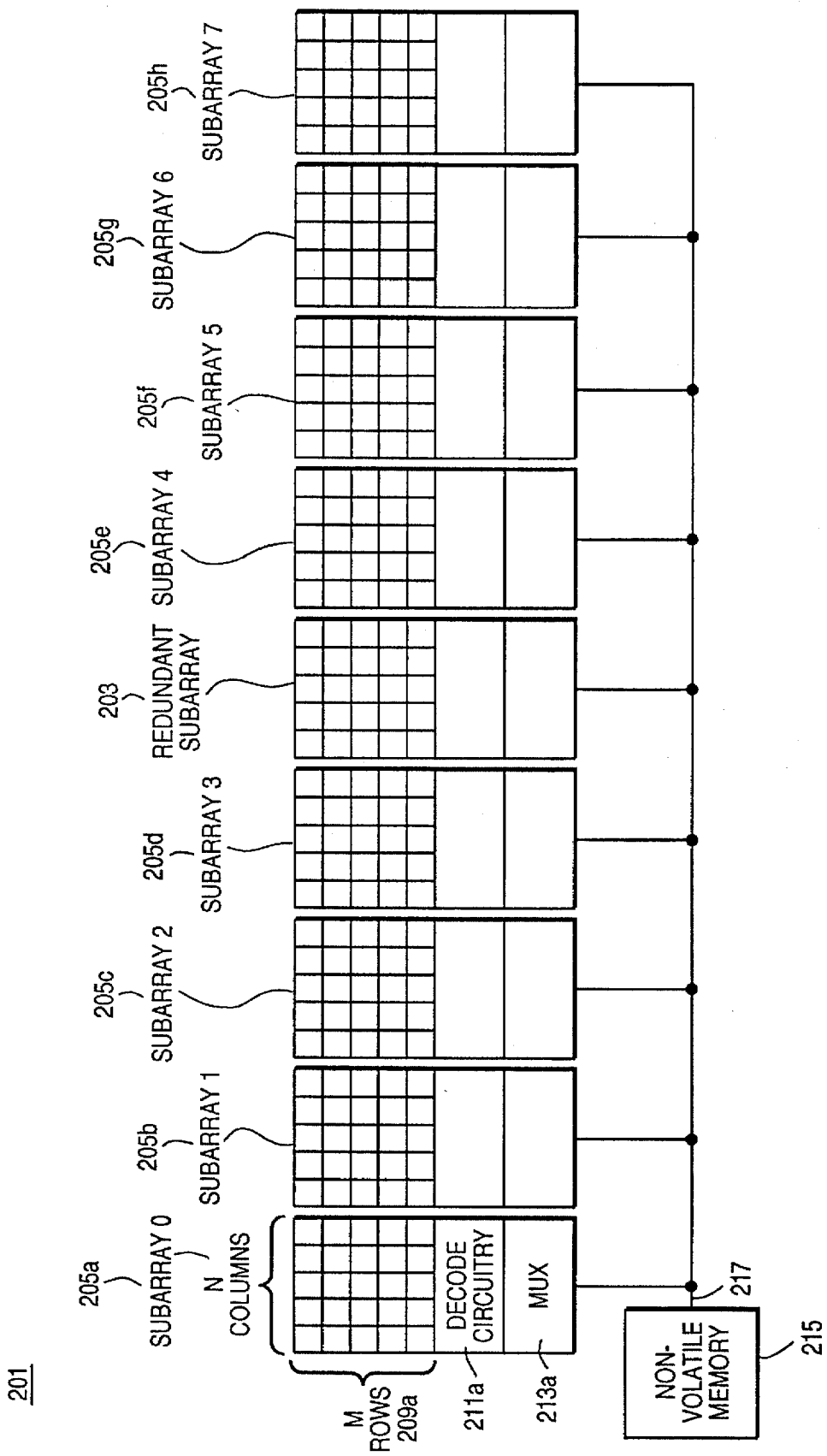
FIG_2A

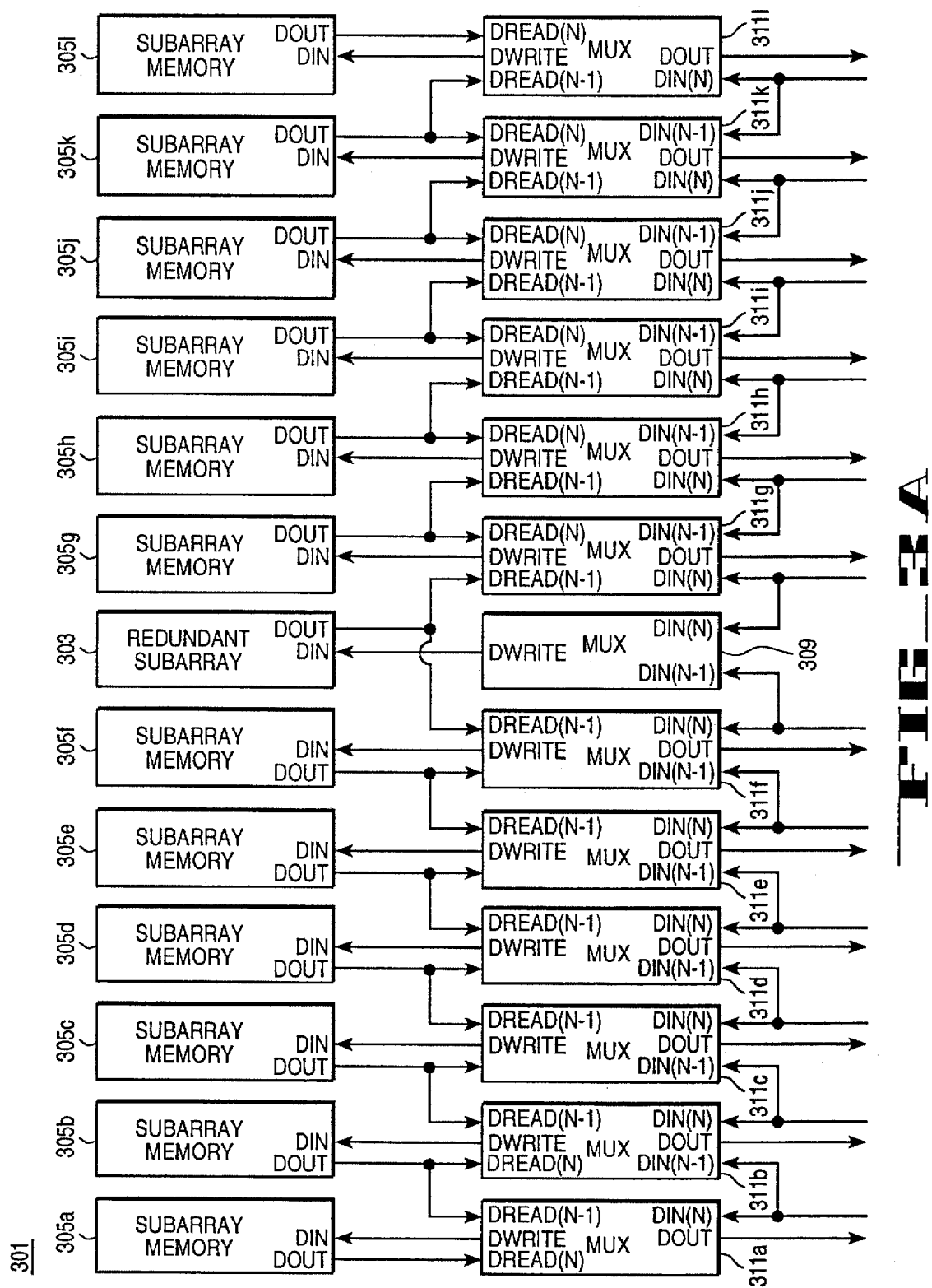

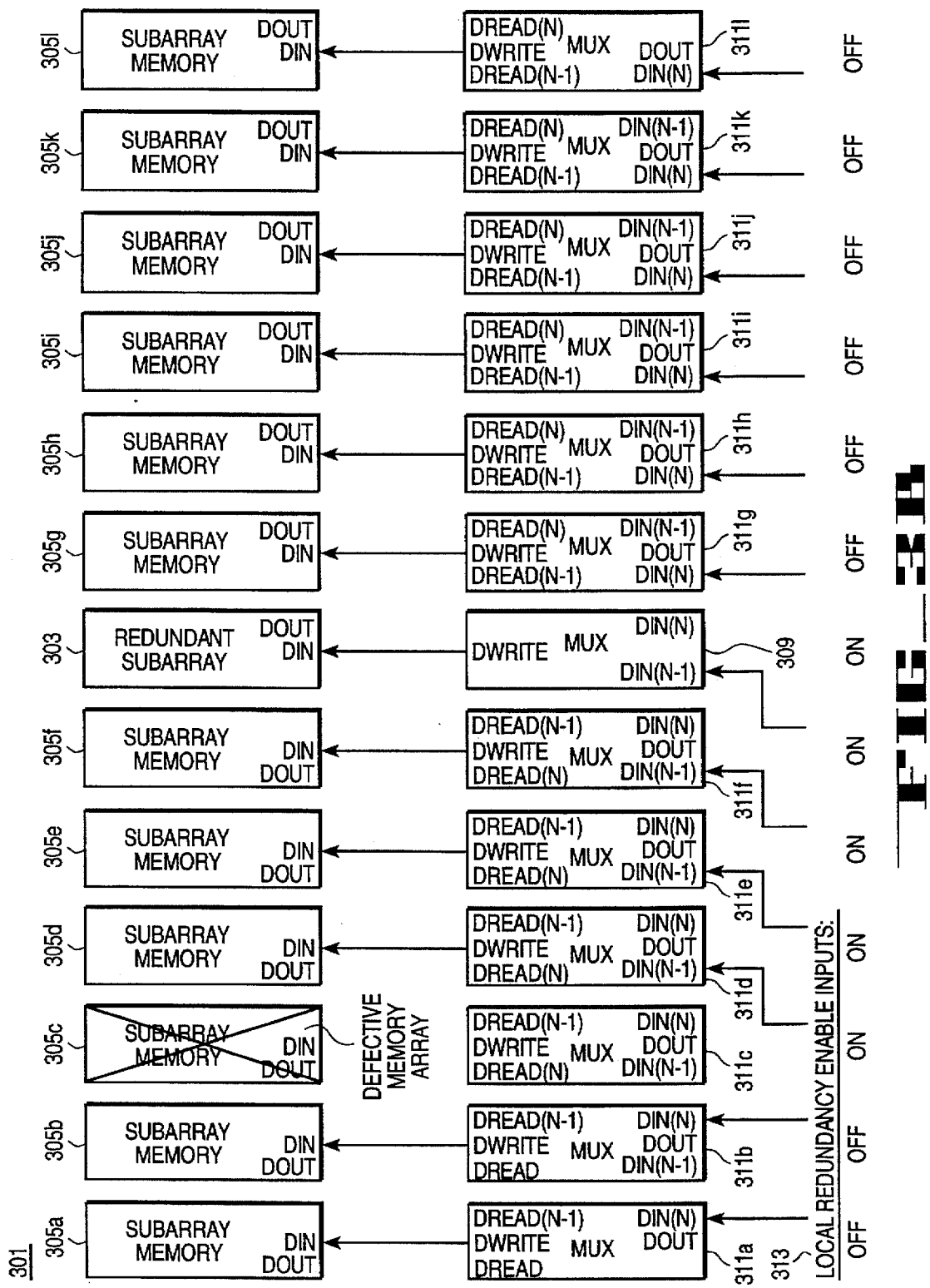

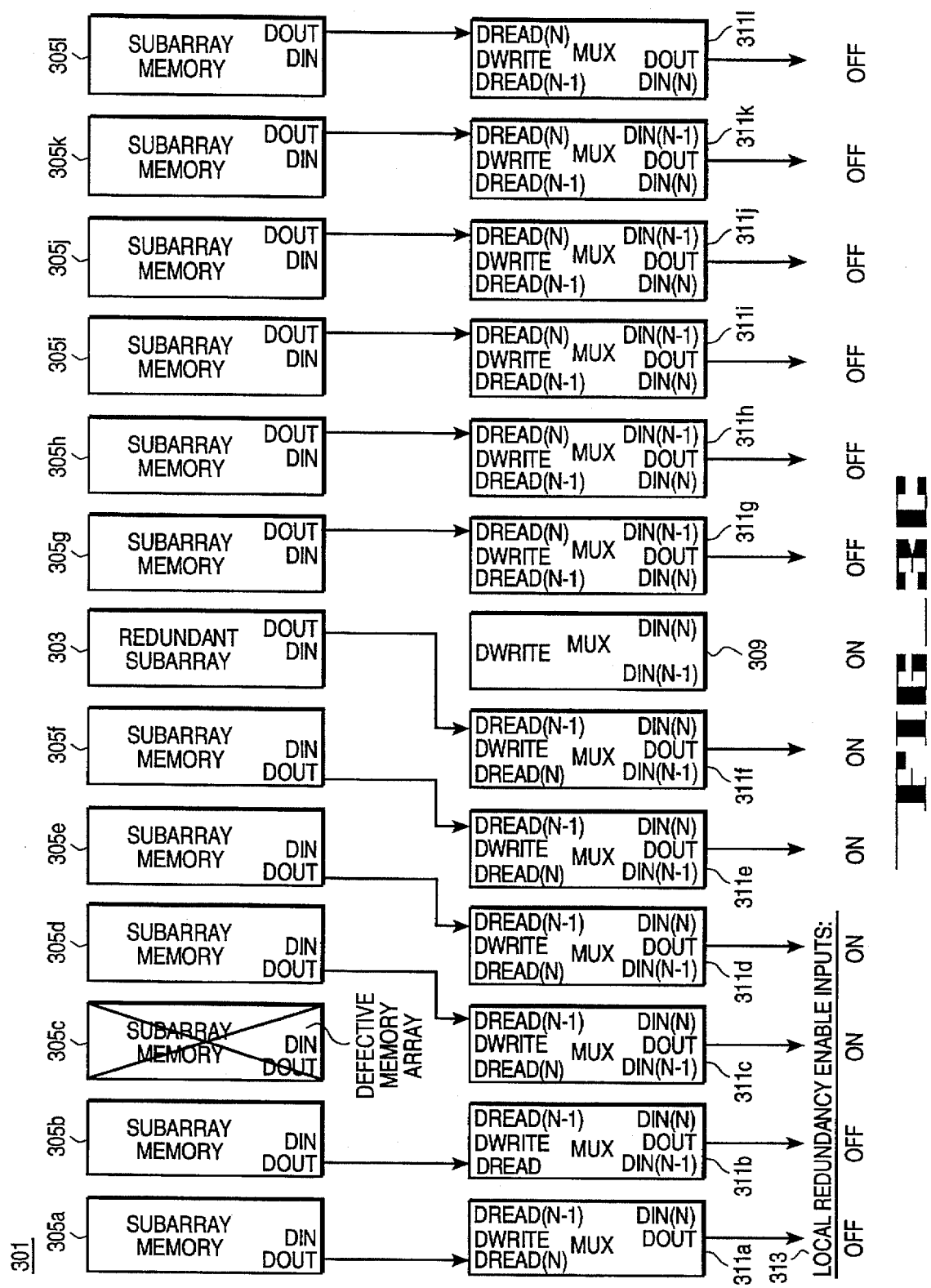
FIG_3C

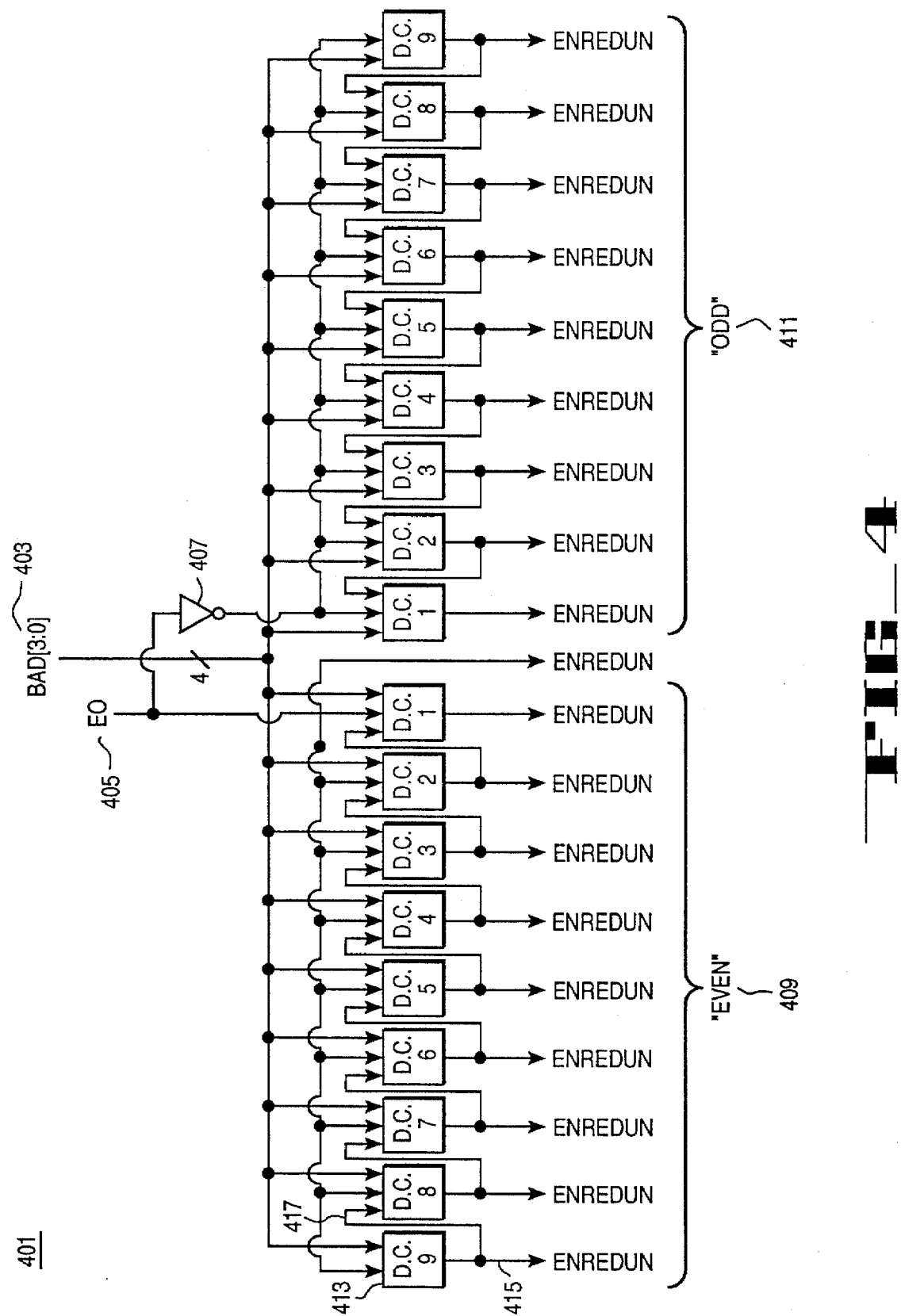
FIG_4

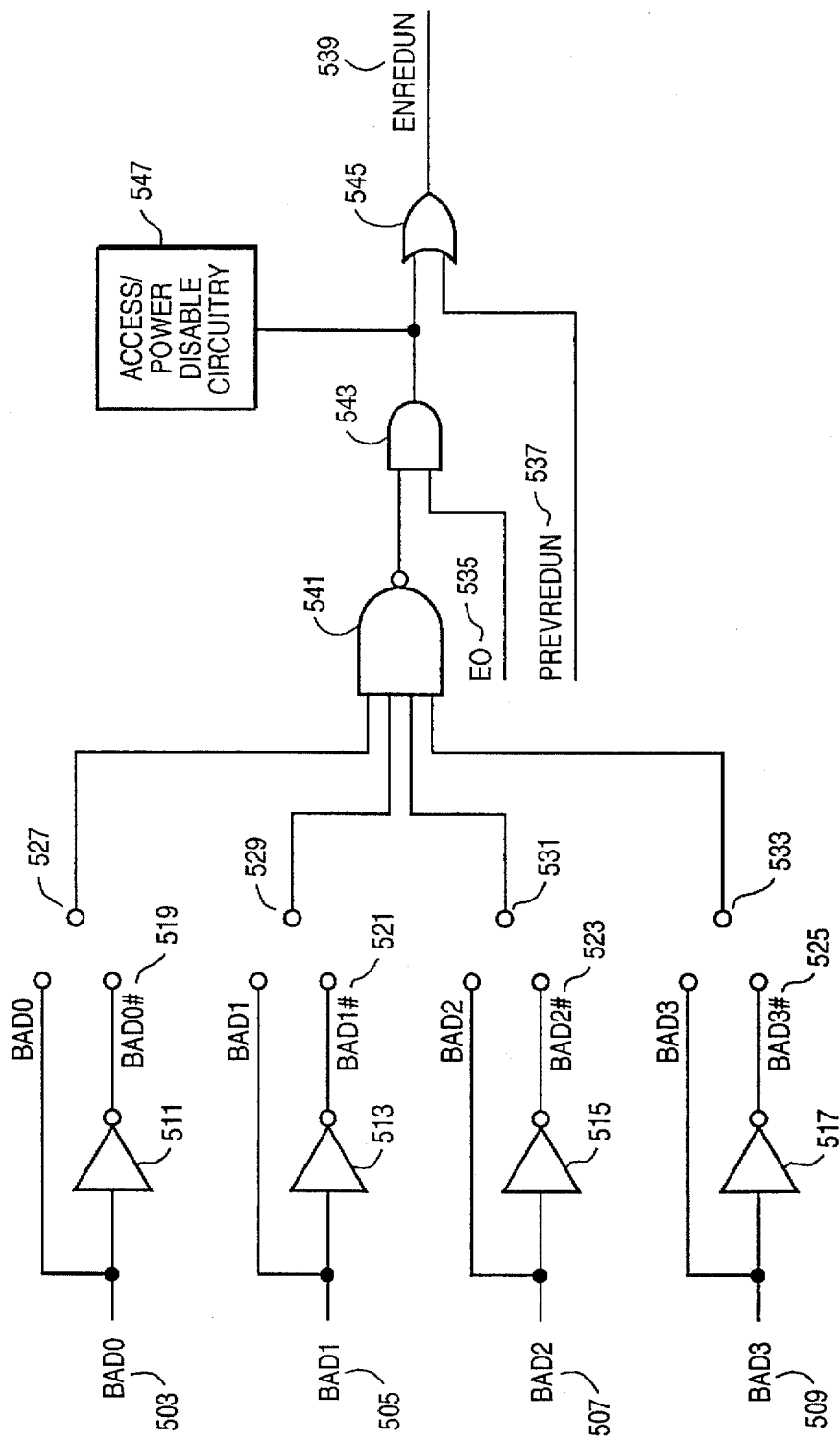
FIG_5

FIG. 6

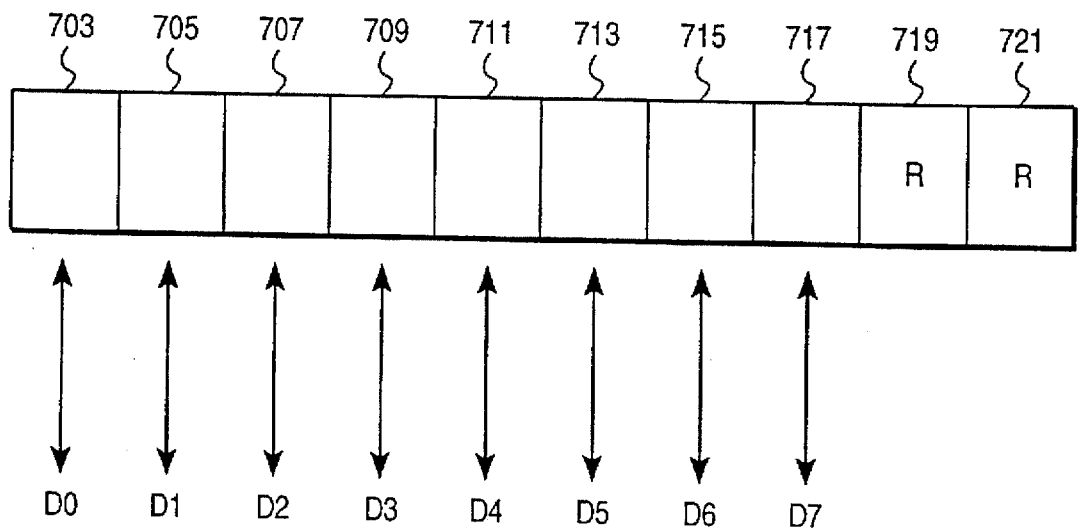
FIG_7A
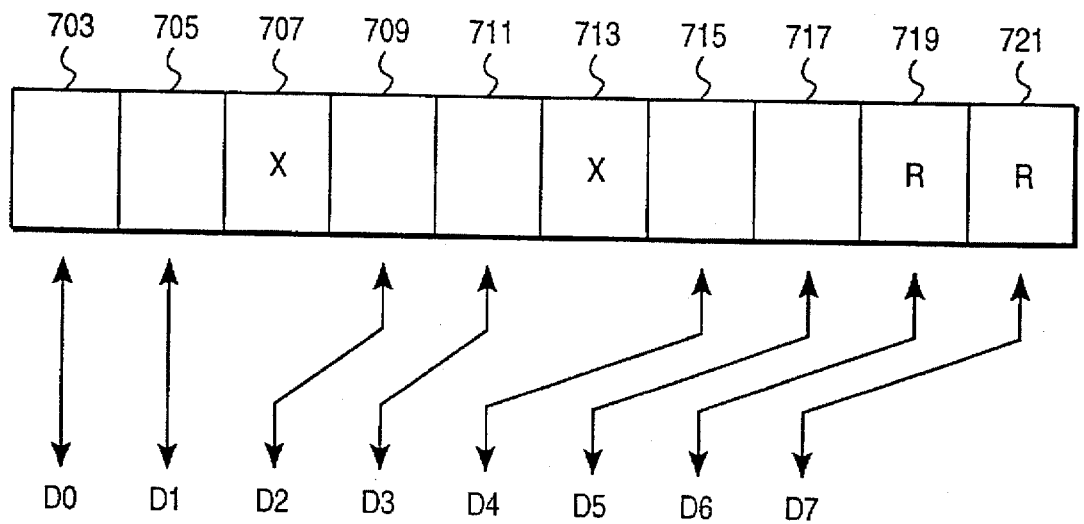
FIG_7B

METHOD AND APPARATUS FOR PROVIDING REDUNDANT MEMORY IN AN INTEGRATED CIRCUIT UTILIZING A SUBARRAY SHUFFLE REPLACEMENT SCHEME

BACKGROUND OF THE INVENTION

1. Field of the Invention

The present invention relates generally to integrated circuits and more specifically, the present invention relates to redundant integrated circuit memories incorporating redundancy.

2. Description of the Related Art

Within the integrated circuit industry there is an ever continuing effort to increase integrated circuit speed, device density as well as maximize integrated circuit yields. These efforts are especially applied to the design and manufacture of integrated circuit memories. Modern integrated circuit memories are commonly made up of many millions of individual memory cells. Without redundancy, if any one memory cell is found to be defective after manufacturing, the entire chip containing the defective memory cell must be discarded, thus reducing the manufacturing yield of the integrated circuit memories.

FIG. 1 shows an illustration of a prior art method for increasing manufacturing yields of integrated circuit memories containing defective memory cells. Prior art integrated circuit memory 101 employs the traditional method of providing redundant memory cells that are used to replace defective memory cells that are detected in an integrated circuit memory. Traditionally, integrated circuit memories are tested after manufacturing. If a defective memory location 111 is detected after testing, a replacement redundant memory cell is provided to "replace" the defective memory cell. Thus, even though the prior art integrated circuit memory contains a defective memory cell, the redundant memory cell may be used in place of the defective memory cell, thus eliminating the need to discard the entire chip.

FIG. 1 shows a prior art integrated circuit memory 101 employing the traditional prior art method of redundancy utilizing row and column replacement. Integrated circuit memory 101 includes memory cells organized into 512 rows 109 by 256 columns 107. Also included in prior art integrated circuit memory 101 are spare row 109Z and spare column 107Z. It is noted that although FIG. 1 shows only one spare row and column 109Z and 107Z in prior art integrated circuit memory 101, other prior art memory redundancy schemes exist in which multiple rows and columns may be provided.

As shown in FIG. 1, defective memory location 111 has been detected in row 109C and column 107B. The memory location of defective memory cell 111 is stored in fuses 103 which is coupled to support circuitry 105. Support circuitry 105 remaps memory accesses to defective memory cell 111 to spare column 107Z and/or spare row 109Z as shown in FIG. 1. Therefore, memory accesses intended for column 107B are remapped to spare column 107Z with support circuitry 105. Similarly, memory accesses designated for row 109C are remapped to spare row 109Z with support circuitry 105.

One problem with prior art integrated circuit memory 101 is the relatively long additional wires needed to remap the replacement rows and columns for the defective memory cells. As can be seen in FIG. 1, accesses to spare column 107Z and spare row 109Z are required to travel through relatively long wires. With the continuing efforts to increase integrated circuit device densities as well as integrated circuit speeds, the wire delay associated with the long additional wires becomes an increasingly significant part of the total delay budget of integrated circuit memories. That is, the additional wires required to employ prior art memory redundancy carry a significant performance penalty.

Another disadvantage of prior art integrated circuit memories employing redundancy, as shown in FIG. 1, is related to the prior art non-volatile memory elements used to identify the defective integrated circuit memory elements. In particular, many bits of information must be specified in order to replace the proper elements. As shown in the prior art example of integrated circuit memory 101 in FIG. 1, 9 bits of information are required to identify the row of defective memory cell 111 and an additional 8 bits of information are required to identify the particular column of defective memory cell 111. Thus, a total of 17 bits of non-volatile memory are required to identify each defective memory cell in prior art integrated circuit memory 101.

Prior art memory redundancy schemes typically employ small fuses for non-volatile memory. Small fuses are used in the prior art in order to minimize the amount of chip area utilized for fuses. Such prior art fuses generally add complexity to integrated circuits and require costly processing steps which must be added to the manufacturing process of redundant memories. With the continuing trend towards increased memory sizes and the need for the costly additional processing steps associated with prior art fuses, the price penalty associated with the prior art fuses of prior art redundant memories becomes increasingly significant.

Thus, what is desired is an improved integrated circuit memory with redundancy. Such an improved integrated circuit memory would provide redundancy with minimal delays associated with the long additional wires necessarily included in prior art redundancy schemes when replacing defective memory cells with spare rows or columns. In addition, the improved integrated circuit memory would provide redundancy with minimal additional cost associated with the provision of non-volatile memory.

SUMMARY OF THE INVENTION

A method and an apparatus for providing memory redundancy in an integrated circuit memory is disclosed. In one embodiment, a plurality of groupings of memory cells is disclosed wherein the plurality of groupings are sequentially organized such that each one of the plurality of groupings is adjacent to at least another one of the plurality of groupings. The plurality of groupings of memory cells includes a redundant grouping of memory cells wherein the redundant grouping is configured to store data designated to be stored in a grouping of memory cells adjacent to the redundant grouping of memory cells. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

FIG. 1 shows an illustration of a prior art integrated circuit memory with redundancy.

FIG. 2A illustrates an integrated circuit memory with redundancy in accordance with the teachings of the present invention.

FIG. 3A illustrates multiplexor circuitry coupled to memory subarrays in accordance with the teachings of the present invention.

FIG. 3B illustrates memory writes through multiplexor circuitry coupled to memory subarrays in accordance with the teachings of the present invention.

FIG. 3C illustrates memory reads through multiplexor circuitry coupled to memory subarrays in accordance with the teachings of the present invention.

FIG. 4 is a block diagram illustrating the decode circuitry associated with each memory subarray in accordance with the teachings of the present invention.

FIG. 5 is a schematic illustrating the logic associated with decode circuitry in accordance with the teachings of the present invention.

FIG. 6 is an illustration of memory organized into subarrays in another embodiment of the present invention.

FIGS. 7A and 7B are illustrations of another embodiment in accordance with the teachings the present invention incorporating multiple redundant subarrays.

DETAILED DESCRIPTION

Figure 2B:
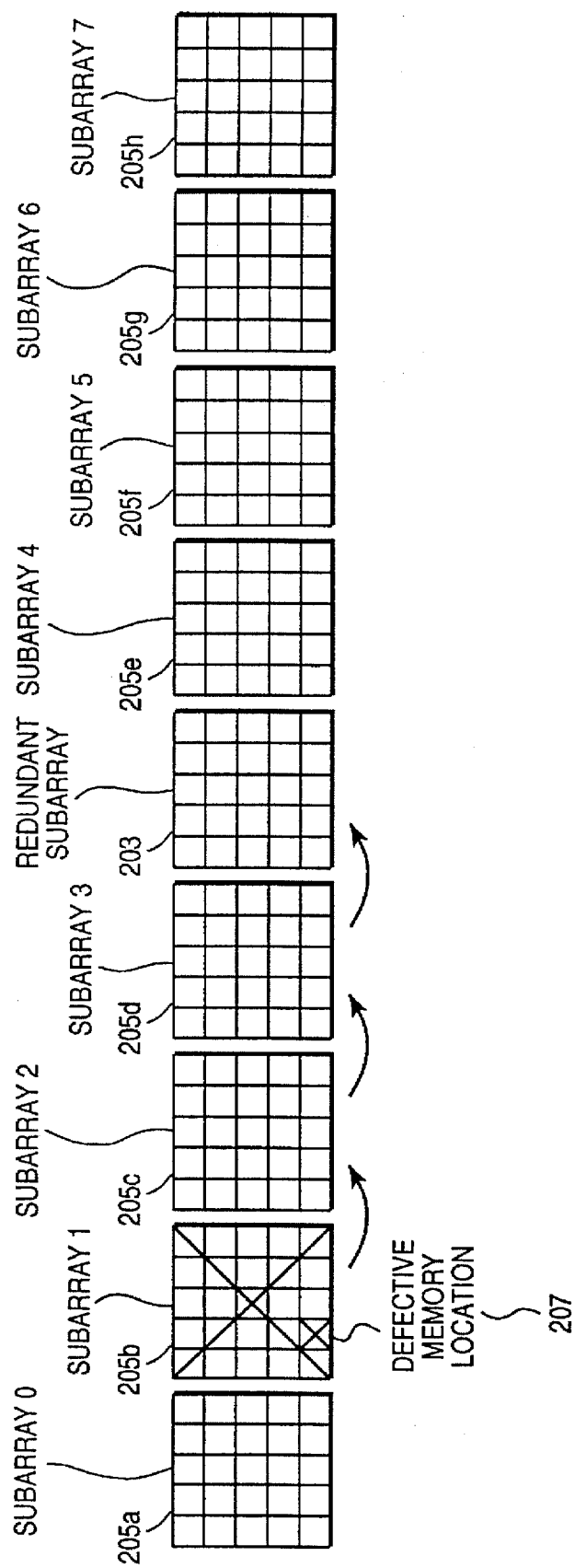
FIG. 2B illustrates an integrated circuit memory shuffling subarrays to the right to provide redundancy in accordance with the teachings of the present invention.

A method and an apparatus for providing an integrated circuit memory with redundancy is disclosed. In the following description, numerous specific details are set forth such as memory sizes, particular data paths and specified couplings in order to provide a thorough understanding of the present invention. It will be apparent, however, to one having ordinary skill in the art that the specific details need not be employed to practice the present invention. In other instances, well known materials or methods have not been described in detail in order to avoid obscuring the present invention.

As indicated above, traditional methods of redundancy commonly employ row and column replacement which necessitates long additional wires to route to the replacement rows or columns. The wire delay associated with the long additional wires significantly compromises performance in high speed memories. In addition, a large number of non-volatile memory elements which add costly processing steps are required to identify defective memory elements in traditional prior art redundant memory schemes. The present invention reduces the wire delays associated with routing replacement rows and columns. In addition, the present invention reduces the number of fuses required to incorporate memory redundancy and thereby permits larger fuses to be used. The larger fuses employed by one embodiment of the present invention do not require the costly additional processing steps associated with the smaller prior art fuses.

FIG. 2A shows an integrated circuit memory 201 with redundancy in accordance with the teachings of the present invention. Integrated circuit memory 201 shows a plurality of memory cells organized into separate groupings 205A through 205H. In one embodiment, the memory cells are organized into M rows and N columns within subarrays, as shown in FIG. 2A.

As will become more apparent below, it is appreciated that the teachings of the present invention are still applicable even if memory cells in an integrated circuit memory are organized into other groupings such as rows or columns instead of subarrays.

Referring back to the embodiment illustrated in FIG. 2A, subarray 0 205A through subarray 7 205H are sequentially organized such that each one of the subarrays is adjacent to at least one other subarray. With respect to the embodiment shown in FIG. 2A, subarray 0 205A is adjacent to subarray 1 205B. Subarray 1 205B is adjacent to subarray 0 205A on the "left" side and adjacent to subarray 2 205C on the "right" side.

Included in the series of sequentially organized subarrays 205A through 205H, is redundant subarray 203. As shown in FIG. 2A, redundant subarray 203 is adjacent to subarray 3 205D on the "left" side and subarray 4 205E on the "right."

It is also appreciated that the "left" and "right" nomenclature used to describe the embodiment shown in FIG. 2A is for illustrative purposes. That is, other directional nomenclature, such as for example "up" and "down," may also have been used, so long as the subarrays are organized in a sequential manner such that each subarray is adjacent to at least one other subarray.

As shown in FIG. 2A, representative subarray 0 205A also includes decode circuitry 211A and multiplexor circuitry 213A in addition to the M rows by N columns of memory cells 209A. Other subarrays in integrated circuit memory 201 are similarly configured. As will become more apparent below, the configuration of redundant subarray 203 in one embodiment is slightly different from the other subarrays in that it is configured to store data only when redundancy is needed. Non-volatile memory 215 is connected to each subarray 205A through 205H through bus connection 217. Non-volatile memory is used to store bits of information identifying a particular subarray 205A through 205H which may contain a defective memory cell.

It is appreciated that since the bits stored in non-volatile memory 215 only identify defective memory locations at the subarray level instead of the memory cell level, substantially fewer bits are required. In particular, each subarray 205A through 205H may contain many memory cells. As a consequence, it would take many bits in non-volatile memory to identify a particular memory cell within each subarray. However, the present invention only requires that a particular subarray be identified instead of individual memory cell locations in order to employ the redundant memory scheme described herein. Therefore, fewer bits are required to be stored in non-volatile memory 215 thus minimizing the number of fuses that must be provided on the integrated circuit substrate.

In one embodiment of the present invention, larger fuses which do not require additional costly processing steps for fabrication are utilized. As a result, an overall savings may be realized in manufacturing integrated circuit memory 201 since fewer fuses are required. In addition, since fewer fuses are required, an overall reduction in the total number of wires is realized with the present invention. With fewer wires needed, an overall savings in chip area may also be realized with the present invention.

After integrated circuit memory 201 is fabricated, it is tested using known methods to detect any defective memory cell locations. If no defective memory cells are identified, then the integrated circuit memory accesses subarrays 205A through 205H and redundant subarray 203 is unused.

Referring now to FIG. 2B, if defective memory location 207 is detected during integrated circuit memory test, information indicating subarray 1 205B is programmed into non-volatile memory 215 (not shown). As a result, memory accesses normally designated for subarray 1 205B are "shuffled" in the direction toward redundant subarray 203. Similarly, memory accesses designated for subarray 2 205C and subarray 3 205D are also "shuffled" towards redundant subarray 203 or to the right in this example. Thus, defective subarray 205B is now unused while redundant subarray 203 is now used. Subarray 0 205A and subarrays 4 205E through 7 205E through 205H operate normally.

As shown by the embodiment illustrated in FIG. 2B, redundancy is implemented without the need for long additional wires to use redundant subarray 203 instead of defective subarray 207 since memory accesses are "detoured" by only one subarray. Therefore, integrated circuit memory 201 incorporates redundancy without a significant performance penalty as required in prior art integrated circuit memory 101. In one embodiment of the present invention, redundant subarray 203 is placed as close as practical to the center section of subarrays 205A through 205H.

It is appreciated that redundant subarray 203 may be positioned anywhere in sequentially organized subarrays 205A through 205H. For example, another embodiment of the present invention may have redundant subarray 203 positioned at the "left" side of sequentially organized subarrays 205A through 205H while another embodiment of the present invention may have redundant subarray 203 positioned at the "right" side of sequentially organized subarrays 205A through 205H. Each of these alternative embodiments still provide a performance advantage over prior art integrated circuit memory 101. If redundant subarray 203 positioned at the "left" side of sequentially organized subarrays 205A through 205H, then only "left" shuffles need to be performed by the present invention for redundancy. Similarly, if redundant subarray 203 positioned at the "right" side of sequentially organized subarrays 205A through 205H, then only "right" shuffles need to be performed by the present invention for redundancy.

Figure 2C:
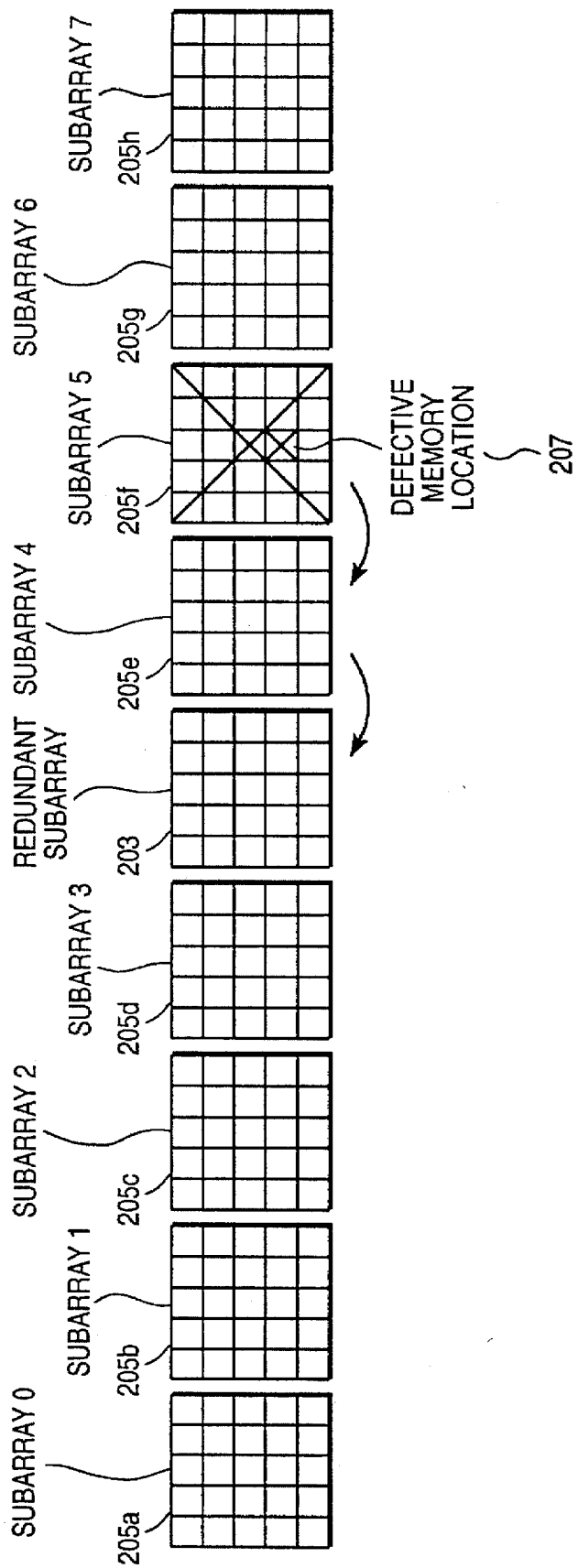
FIG. 2C illustrates an integrated circuit memory shuffling subarrays to the left to provide redundancy in accordance with the teachings of the present invention.

Referring now to FIG. 2C, another example of the "subarray shuffle" is shown with defective memory location 207 now detected in subarray 205F. Similar to the example described with reference to FIG. 2C, defective subarray 205F is unused because of the defective memory location 207. As a result, memory accesses designated for subarray 205F are now "shuffled" in a direction towards redundant array 203, or to the left in this example. Thus, accesses designated for subarray 205F are now directed to subarray 205E. Similarly, accesses designated for subarray 265E are now directed to redundant subarray 203. Therefore, with redundant integrated circuit memory 201, defective subarray 205F is unused while redundant subarray 203 is used. Memory accesses to subarrays 205A through 205D and 205G through 205H remained unchanged.

Referring now to FIG. 3A, integrated circuit memory 301 is shown with sequentially organized subarray memories 305A through 305L and associated mulitplexor circuitry, MUXs 311A through 311L. Also shown in FIG. 3A are redundant subarray memory 303 and associated multiplexor circuitry MUX 309. FIG. 3A illustrates how each MUX 311,309 is coupled to its respective subarray memory 305, 303 as well as the data input and output paths of each multiplexor's respective adjacent neighbors.

As shown in FIG. 3A, each subarray memory 305 has a data input and data output, DIN and DOUT respectively. For example, referring specifically to exemplary subarray memory 305C, data writes to subarray memory 305C are accessed through data input DIN and data writes are accessed through data output DOUT. Correspondingly, multiplexor circuitry 311C directs data reads from subarray memory 305C through DREAD(N) and DOUT of MUX 311C. Similarly, data writes to subarray memory 305C are directed through MUX 311C through the DIN(N) input through the DWRITE output of MUX 311C into the DIN input of subarray memory 305C. As also illustrated in FIG. 3A, MUX 311C of subarray memory 305C is also coupled to receive the input data designated to be stored in subarray memory 305B through DIN(N−1). Subarray memory 305B is the adjacent subarmy to subarray memory 305C in the direction opposite of redundant subarray memory 303. MUX 311C is also coupled to receive the data output from subarray memory 305D through DREAD(N−1). Subarray memory 305D is adjacent subarray to subarray memory 305C in the direction towards redundant subarray memory 303. It is noted that each of the other subarray memories 305A through 305B and 305D through 305L operate in substantially the same way with their respective mulitplexor circuitry 311A through 311B and 311D through 311L. Since MUX 309 is associated with redundant subarray memory 303, MUX 309 is only coupled to receive data designated to be stored in either of its two adjacent subarrays through DIN(N) or DIN(N−1). That data is directed into the memory of redundant subarray memory 303 through DWRITE.

As mentioned above with respect to the discussion concerning FIG. 2, redundant subarray memory 303 and its associated multiplexor circuitry 309 is unused if no defects are detected during test in any of the subarray memories 305A through 305L. If, however, a defect is detected in one of the subarray memories, operation of integrated circuit memory 301 is as follows. It is noted that the present invention provides memory redundancy not only for defective memory cells, but also for other defective memory circuit elements such as decoders, sense amps, or the like so long as there is no short circuit between power and ground. That is, the redundant subarray can generally be used in place of the defective subarray irrespective of the type of defect in the defective subarray so long as the defect is limited to the particular subarray and the remainder of the present integrated circuit memory functions normally.

Referring now to FIG. 3B, assume that a defective memory cell is detected in subarray memory 305C as shown. As a result, data contained in the non-volatile memory (not shown) of integrated circuit memory 301 is programmed to indicate that subarray memory 305C is a defective memory subarray. Accordingly, the local redundancy enable inputs 313 for each respective subarray will be as shown in FIG. 3B. That is, the local redundancy enable input 313 for subarrays 305A through 305B and 305G through 305L are all "off." The local redundancy enable inputs 313 for subarray memories 305C through 305F are all "on."

As a result, defective memory subarray 305C is not accessed and memory accesses designated for subarray memory 305C are "shuffled" in the direction towards redundant subarray memory 303, or to the "right" as shown in this example. FIG. 3B shows how each subarray memory 305A through 305L and redundant subarray memory 303 are accessed for data writes. Memory writes to subarray memories 305A through 305B and subarray memories 305G through 305L are accessed directly through their respective multiplexor circuitry 311A through 311B and 311G through 311L. However, note that multiplexor circuitry 311D accesses the data input designated for subarray memory 305C and that data input is directed to subarray memory 305D instead. Similarly, note how the data inputs designated for subarray memories 305D through 305F are also "shuffled" to the right such that each subarray memory 305D through 305F and redundant subarray memory 303 receive the data designated to be stored in the adjacent subarray memory in the direction opposite of redundant subarray memory 303.

It is noted that to clarify understanding of the present invention, other memory couplings are not shown in FIG. 3B even though they still exist as shown in FIG. 3A.

Continuing with the same example discussed above, FIG. 3C shows how data reads are implemented with the present invention. Note that the local redundancy enable inputs 313 are the same as discussed in the example with respect to FIG. 3B. That is, the local redundancy enable input signals for subarray memories 305A through 305B and 305G through 305L are all "off." Similarly, note how the local redundancy enable inputs for subarray memories 305C through 305F are all "on." As a result, data reads from each subarray 305A through 305B and 305G through 305L are all directed through each of their respective multiplexor circuitry 311A through 311B and 311G through 311L. However, with respect to subarray memories 305D through 305F and redundant subarray memory 303, note how multiplexor circuitry 311C through 311F "shuffle" the read data from subarray memories 305D through 305F and redundant subarray memory 303 to the "left," or in a direction opposite of the redundant subarray memory 303.

Similar to FIG. 3B, it is noted that only the couplings pertinent to data reads from subarray memories 305A through 305L are shown and other couplings are not shown even though they still exist in order to clarify understanding of the present invention.

FIG. 4 shows how the decode circuitry associated with each subarray memory of the present invention is coupled together in order to generate the local redundancy enable signals for each of the subarrays as discussed in FIGS. 3B through 3C. As discussed in FIG. 2A, each subarray memory 205 has an associated decode circuit 211. FIG. 4 shows the logic for one embodiment of the present invention which includes 18 subarrays organized in a sequential manner in accordance with the teachings of the present invention. Thus, nine even decode circuits 409 appear on the left hand side of FIG. 4 and nine odd decode circuits 411 appear on the right hand side of FIG. 4. Each decode circuit 413 is coupled to receive inputs from non-volatile memory (not shown) BAD[3:0] 403 and E/O input 405. It is noted that the even/odd output, E/O 405 is inverted with inverter 407 for "odd" decode circuits 411 and E/O 405 is not inverted for "even" decode circuits 409.

Each decode circuit 413 generates the local redundancy enable output 415 for each subarray. The local redundancy enable input for each subarray is also received by the decode circuit of the adjacent subarray memory in the direction towards the redundant subarray memory. In FIG. 4, the local redundancy enable signal 415 is therefore passed to the adjacent decode circuit towards the center of FIG. 4. Each decode circuit generates the local redundancy enable signal 415 for the subarray memory in response to the inputs received from the non-volatile memory as well as the adjacent decode circuit 413 in the direction opposite of the redundant subarray.

FIG. 5 shows the logic 501 included in each decode circuit shown in FIG. 4. As described above, non-volatile memory stores data identifying a particular defective subarray. The defective subarray address is encoded in BAD0 503 through BAD3 509 and E/O 535. As shown in FIG. 5, logic 501 internally inverts each BAD signal 503 through 509 with inverters 511 through 517. The inputs 527 through 533 of AND gate 541 are coupled to BAD0 503 through BAD3 509 and BAD0# 519 through BAD3# 525 depending on the subarray to which logic 501 is associated. For example, in one embodiment, if logic 501 is associated with the decode circuitry of subarray 5, or "0101" in binary, BAD[3:0] would be set to equal "0101." Accordingly, inputs 527 and 531 would be coupled to BAD0 503 and BAD2 507 respectively. Inputs 529 and 533 would be coupled to BAD1# 521 and BAD3# 525 respectively. With the assumption that subarray memory 5 on the "even" side of FIG. 4, E/O 405 would be programmed to equal a "1."

Thus, referring to FIG. 5, each of the inputs 527 through 533 of AND gate 541 would receive a "1" with E/O 535 also receiving a "1." Both inputs to AND gate 543 would also receive a "1" which would also be received by the input of OR gate 545. As a result, the local redundancy enable signal ENREDUN 539 would be "on." Also, it is noted that the ENREDUN 539 signal is received by the decode circuitry of the adjacent subarray in the direction towards the redundant subarray at the PREVREDUN 537 input signal. Therefore, even though the BAD[3:0] signal lines may not carry the address of the adjacent subarray, the local redundancy enable signal for that subarray would still be activated because the PREVREDUN 537 signal would be "on."

In one embodiment of the present invention, logic 501 also includes access/power disable circuitry 547 which is coupled to the output of AND gate 543. When the output of AND gate 543 is "on," it means that particular subarray contains the defective memory location. As a result, that particular subarray is not accessed since redundancy is enabled. Thus, in order to save on power consumption, access/power disable circuitry 547 disables accesses to that subarray as well as power consumption in that particular subarray. It is appreciated that even if power and access are not disabled to the particular subarray, the subarray still may send and receive data without interfering with the normal operation of the present integrated circuit memory. The multiplexor circuitry of the subarray containing the defective memory cell described above simply bypasses the defective subarray such that it is inconsequential if the defective subarray is operating or not.

Figure 6:
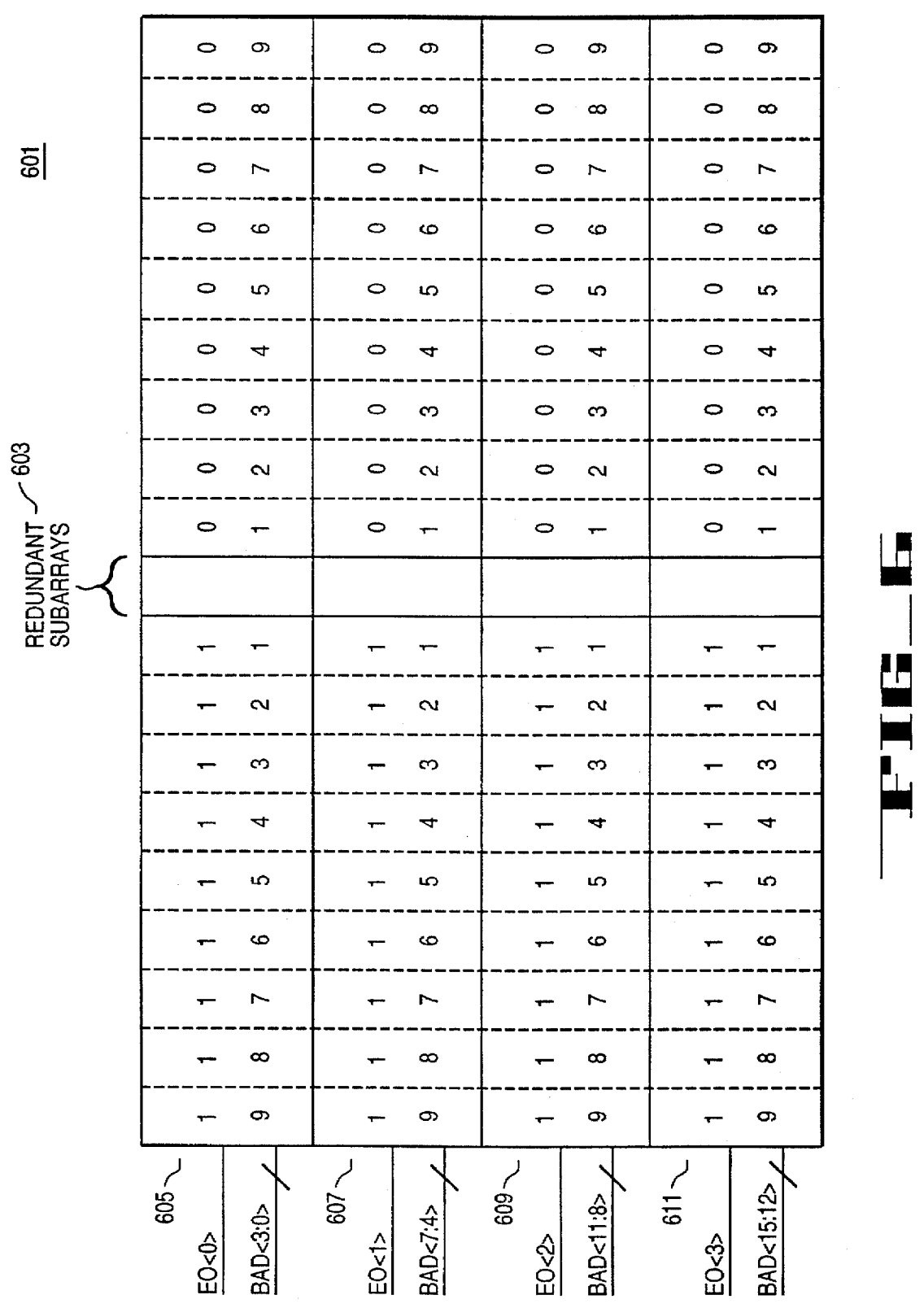

FIG. 6 shows another embodiment of the present invention, integrated circuit memory 601 which incorporates the "subarray shuffle" method of the present invention. Integrated circuit memory 601 includes four series of sequentially organized subarrays 605 through 611. Each sequentially organized set of subarrays includes a redundant subarray 603 as well as 18 subarrays which may be identified with bad signals BAD[15:0] and even/odd signal E/O [3:0] received from non-volatile memory. Therefore, each set of sequentially organized subarrays 605 through 611 may each contain a defective subarray and still function properly. E/O[0] and BAD[3:0] would identify a defective subarray in the top set of sequentially organized subarrays 605. E/O[1] and BAD[7:4] would identify a defective subarray in subarrays 607. E/O[2] and BAD[11:8] would identify a defective subarray in subarrays 609. Finally, E/O[3] and BAD [15:12] would identify a defective subarray in subarrays 611.

FIG. 7A is an illustration of another embodiment of the present invention employing multiple redundant memory subarrays. Redundant integrated circuit memory 701 includes sequentially organized memory subarrays 703 through 717. As shown in FIG. 7A, redundant memory subarrays 719 and 721 are positioned at the "right" end of sequentially organized memory subarrays 703 through 717. It is appreciated that redundant memory subarrays 719 and 721 may also be positioned at the "left" end of redundant memory subarrays 719 and 721 or dispersed anywhere between subarrays 703 and 717. In addition, as will become evident below, redundant memory subarrays 719 and 721 need not be positioned adjacent to one another.

In the embodiment shown in FIG. 7A, redundant integrated circuit memory 701 provides memory redundancy with up to two defective subarrays 703 through 717. To illustrate, if no defects are detected in redundant integrated circuit memory 701, then data D0 is written to and read from subarray 703. Similarly, data D1 through D7 are written to and read from subarrays 705 through 719 respectively, as shown in FIG. 7A.

Referring now to FIG. 7B, assume that defects are detected in subarrays 707 and 713. Data D0 and D1 are still written to and read from subarrays 703 and 705. However, since subarray 707 is defective, data D2 is "shuffled right" to subarray 709. Data D3 is also "shuffled right" to subarray 711, as shown in FIG. 7B. Since subarray 713 is defective, data D4 is "shuffled right" to subarray 715. Similarly, data D5 through D7 are also "shuffled right" to subarray 717 and redundant subarrays 719 and 721 respectively.

Accordingly, it is appreciated that the present invention is neither limited to using a single redundant subarray in a set of sequentially organized subarrays nor limited to shifting by only one subarray data designated for a particular subarray. That is, if N redundant subarrays are included in a set of sequentially organized subarrays, the data may be shifted or re-routed by up to N subarrays to implement memory redundancy as shown in FIG. 7B. In effect, the subarrays of the present invention are not limited to storing data designated for the particular subarray or an adjacent subarray. When multiple redundant subarrays are used, the subarrays of the present invention may store data designated for adjacent or a non-adjacent subarray in order to implement a subarray shuffle scheme in accordance with the teachings of the present invention.

In sum, an integrated circuit memory with redundancy is provided with the present invention with minimal non-volatile elements, such as fuses, as well as without the long additional wires required by prior art redundant integrated circuit memories. Without the long additional wires required for redundancy, integrated circuit speed and performance are maximized. In addition, with minimal non-volatile fuse elements required by the present invention, inexpensive fuses which require no additional costly processing steps may be used by the present invention which minimizes overall cost, complexity and chip area.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An integrated circuit memory comprising:
   a plurality of groupings of memory cells, the plurality of groupings sequentially organized such that each one of the plurality of groupings is adjacent to at least another one of the plurality of groupings; and
   a redundant grouping of memory cells included in the plurality of groupings of memory cells wherein the redundant grouping of memory cells is configured to store data designated to be stored in a grouping of memory cells adjacent to the redundant grouping of memory cells, each of the plurality of groupings of memory cells configured to store data designated to be stored in an adjacent grouping of memory cells in a direction opposite the redundant grouping of memory cells.

2. The integrated circuit memory described in claim 1 wherein each one of the plurality of groupings of memory cells is a row of memory cells.

3. The integrated circuit memory described in claim 1 wherein each one of the plurality of groupings of memory cells is a column of memory cells.

4. The integrated circuit memory described in claim 1 wherein each one of the plurality of groupings of memory cells is a subarray of memory cells, wherein each said subarray includes a plurality of rows of memory cells and a plurality of columns of memory cells, wherein the redundant grouping of memory cells is a redundant subarray.

5. The integrated circuit memory described in claim 4 wherein each said subarray is configured to store data designated to be stored in an adjacent subarray in a direction opposite of the redundant subarray.

6. The integrated circuit memory described in claim 5 further including non-volatile storage elements, the non-volatile storage elements configured to store data to indicate a first subarray, wherein data designated to be stored in the first subarray is configured to be stored in an adjacent subarray in a direction toward the redundant subarray.

7. The integrated circuit memory described in claim 6 wherein each subarray between the redundant subarray and the first subarray, including the redundant subarray, is configured to store data designated to be stored in a subarray adjacent to each subarray in the direction opposite of the redundant subarray.

8. The integrated circuit memory described in claim 6 wherein the non-volatile storage elements are fuses.

9. The integrated circuit memory described in claim 6 wherein each said subarray further includes decode circuitry coupled to the non-volatile storage elements and decode circuitry associated with an adjacent subarray in the direction opposite of the redundant subarray, the decode circuitry coupled to generate a local redundancy enable signal.

10. The integrated circuit memory described in claim 9 wherein each said subarray further includes multiplexor circuitry, the multiplexor configured to direct data to and from the memory cells of the subarray in response to the local redundancy enable signal, the multiplexor further configured to read input data designated to be stored in the memory cells associated with the adjacent subarray in the direction opposite of the redundant subarray in response to the local redundancy enable signal, the multiplexor further configured to read output data from the memory cells associated with the adjacent subarray in the direction toward the redundant subarray in response to the local redundancy enable signal.

11. The integrated circuit memory described in claim 6 wherein access to the first subarray memory cells is disabled.

12. The integrated circuit memory described in claim 6 wherein power consumption of the first subarray memory cells is disabled.

13. The integrated circuit memory described in claim 1 wherein the redundant grouping of memory cells is further configured to store data designated to be stored in a grouping of memory cells non-adjacent to the redundant grouping of memory cells.

14. In an integrated circuit memory, a method for providing memory redundancy, the method comprising the steps of:
   organizing the integrated circuit memory into subarrays, wherein, each subarray includes rows and columns of memory cells;
   organizing the subarrays into sequential order such that each of the subarrays is adjacent to another subarray;

designating one of the subarrays as a redundant subarray wherein the redundant subarray is configured to store data designated to be stored in a subarray adjacent to the redundant subarray; and identifying a first subarray, each subarray between the redundant subarray and the first subarray, including the redundant subarray, configured to store data designated to be stored in a subarray adjacent to each subarray in a direction opposite of the redundant subarray.

15. The method described in claim 14 including the additional step of disabling access to the first subarray.

16. The method described in claim 14 including the additional step of disabling power to the first subarray.

17. The method described in claim 13 including the additional step of generating a local redundancy enable signal in each subarray between the redundant subarray and the first array inclusive.

18. The method described in claim 17 wherein each subarray includes an associated multiplexor, the associated multiplexor directing input data to and output data from the memory cells of each subarray.

19. The method described in claim 18 wherein the associated multiplexor of each subarray performs the steps of:

reading input data designated to be stored in the memory cells of the adjacent subarray in the direction opposite of the redundant subarray in response to the local redundancy enable signal; and reading output data from the memory cells of the adjacent subarray in a direction toward the redundant subarray in response to the local redundancy enable signal.

20. The method described in claim 17 wherein the first subarray is identified using data stored in non-volatile memory.

21. The method described in claim 20 including the additional step of coupling decode circuitry in each subarray to the non-volatile memory and to receive the local redundancy enable signal generated by the adjacent subarray in the direction opposite of the redundant subarray, wherein the local redundancy enable signal is generated in response to the data stored in non-volatile memory and the local redundancy enable signal generated by the adjacent subarray.

22. The method described in claim 14 wherein the redundant subarray is further configured to store data designated to be stored in a non-adjacent subarray to the redundant subarray.

23. An integrated circuit memory comprising:

memory cells organized into subarrays of rows and columns, wherein the subarrays are sequentially organized such that each subarray is adjacent to another subarray;

a redundant subarray included in the sequentially organized subarrays, wherein the redundant subarray is adjacent to another subarray;

multiplexor means in each subarray for directing input data to and output data from the memory cells of each subarray, the multiplexor means further coupled to receive input data to an adjacent subarray in a direction opposite of the redundant subarray, the multiplexor means further coupled to receive output data from an adjacent subarray in a direction toward the redundant subarray.

24. The integrated circuit memory described in claim 23 further comprising:

data identifying a first subarray stored in storage means;

decoder means in each subarray for generating a local redundancy enable signal in each subarray, the decoder means coupled to the storage means and to the local redundancy enable signal of an adjacent subarray in the direction opposite of the redundant subarray, the local redundancy enable signal in each subarray generated in response to the data identifying a first subarray and the local redundancy enable signal of the adjacent subarray.

25. The integrated circuit memory described in claim 24 wherein the multiplexor means in each subarray reads input data designated to be stored in the memory cells of the adjacent subarray in the direction opposite of the redundant subarray in response to the local redundancy enable signal and wherein the multiplexor means in each subarray reads output data from the memory cells of the adjacent subarray in a direction toward the redundant subarray in response to the local redundancy enable signal.

26. The integrated circuit memory described in claim 24 further comprising power disable means in each subarray for disabling power consumption of each subarray when each subarray is identified as the first subarray, the power disable means further disabling access to each subarray when each subarray is identified as the first subarray.

27. An integrated circuit memory comprising:

a plurality of subarrays of rows and columns of memory cells, wherein the plurality of subarrays is organized sequentially such that each one of the plurality of subarrays is adjacent to another one of the plurality of subarrays;

a redundant subarray included in the plurality of subarrays, the redundant subarray having an adjacent subarray in the plurality subarrays;

a non-volatile storage configured to store data identifying a first subarray included in the plurality of subarrays;

a decode circuit included in each one of the plurality of subarrays, the decode circuit generating a local redundancy enable signal in each one of the plurality of subarrays in response to the data identifying the first subarray and a local redundancy enable signal generated by a decode circuit of an adjacent subarray in a direction opposite of the redundant subarray; and a multiplexor circuit included in each one of the plurality of subarrays, the multiplexor circuit directing input data to and output data from the memory cells of each one of the plurality of subarrays, the multiplexor circuit further coupled to read input data directed to be stored in the memory cells of the adjacent subarray in the direction opposite of the redundant subarray in response to the local redundancy enable signal, the multiplexor circuit further coupled to read output data from the memory cells of the adjacent subarray in a direction toward the redundant subarray in response to the local redundancy enable signal.

28. The integrated circuit described in claim 27 further comprising a power disable circuit in each one of the plurality of sequentially organized subarrays, the power disable circuit disabling power in each one of the plurality of sequentially organized subarrays when each one of the plurality of sequentially organized subarrays is identified to be the first subarray.

* * * * *